US009647123B1

(12) United States Patent
Balakrishnan et al.

(10) Patent No.: US 9,647,123 B1
(45) Date of Patent: May 9, 2017

(54) SELF-ALIGNED SIGMA EXTENSION REGIONS FOR VERTICAL TRANSISTORS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/294,345

(22) Filed: Oct. 14, 2016

(51) Int. Cl.
| | |
|---|---|
| H01L 29/78 | (2006.01) |
| H01L 21/762 | (2006.01) |
| H01L 29/786 | (2006.01) |
| H01L 29/423 | (2006.01) |
| H01L 29/66 | (2006.01) |
| H01L 27/112 | (2006.01) |
| H01L 21/8238 | (2006.01) |
| H01L 27/092 | (2006.01) |

(52) U.S. Cl.
CPC ........... *H01L 29/78618* (2013.01); *H01L 21/823821* (2013.01); *H01L 21/823885* (2013.01); *H01L 27/0924* (2013.01); *H01L 27/11273* (2013.01); *H01L 29/42392* (2013.01); *H01L 29/66666* (2013.01); *H01L 29/66712* (2013.01); *H01L 29/66795* (2013.01); *H01L 29/7802* (2013.01); *H01L 29/785* (2013.01); *H01L 29/7831* (2013.01); *H01L 29/78642* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 6,087,235 | A | 7/2000 | Yu |
| 8,659,112 | B2 | 2/2014 | Nandakumar et al. |
| 8,906,768 | B2 | 12/2014 | Wong et al. |
| 8,946,791 | B2 | 2/2015 | Basker et al. |
| 9,076,817 | B2 | 7/2015 | Pei et al. |
| 9,093,466 | B2 | 7/2015 | Pei et al. |

(Continued)

*Primary Examiner* — Minh-Loan Tran
(74) *Attorney, Agent, or Firm* — Scully, Scott, Murphy & Presser, P.C.; Louis J. Percello, Esq.

(57) ABSTRACT

A semiconductor structure including vertical transistors is provided in which a sigma shaped source/drain extension region is formed between a top faceted surface of a first region of an epitaxial semiconductor channel material and a bottom faceted surface of a second region of the epitaxial semiconductor channel material. The sigma shaped source/drain extension region is formed after formation of a functional gate structure on each side of an epitaxial semiconductor channel material by first removing a sacrificial bottom spacer layer of a bottom spacer material stack, performing a sigma etch on an exposed lower portion of the epitaxial semiconductor channel material to provide the first region of epitaxial semiconductor channel material and the second region of the epitaxial semiconductor channel material, and then epitaxially growing the sigma shaped source/drain extension region from the faceted surfaces of the first and second regions of epitaxial semiconductor channel material.

20 Claims, 14 Drawing Sheets

(56) References Cited

U.S. PATENT DOCUMENTS

| | | |
|---|---|---|
| 9,252,272 B2 | 2/2016 | Liu et al. |
| 2012/0161240 A1 | 6/2012 | Kronholz et al. |
| 2013/0154029 A1* | 6/2013 | Cai .................. H01L 29/66795 257/402 |
| 2014/0252501 A1 | 9/2014 | Cheng et al. |
| 2015/0137193 A1* | 5/2015 | Cheng ................ H01L 29/7842 257/288 |
| 2015/0179797 A1* | 6/2015 | Yin .................. H01L 29/66636 257/192 |
| 2015/0303192 A1* | 10/2015 | Zhu .................. H01L 21/82382 257/401 |
| 2015/0340465 A1* | 11/2015 | Harley ............. H01L 29/66636 438/299 |
| 2016/0093720 A1* | 3/2016 | Chudzik ............ H01L 29/7848 438/157 |
| 2016/0111322 A1 | 4/2016 | Liu et al. |

\* cited by examiner

SELF-ALIGNED SIGMA EXTENSION REGIONS FOR VERTICAL TRANSISTORS

BACKGROUND

The present application relates to a semiconductor structure and a method of forming the same. More particularly, the present application relates to a semiconductor structure containing vertical transistors having optimized source/drain extension regions and a method of forming the same.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control. As such, vertical transistors are an attractive option for technology scaling for 5 nm and beyond.

One difficult challenge in forming vertical transistors is the variation in gate length, spacer thickness and source/drain extension doping profile due to the integration challenges posed by the vertical orientation of the transistors. There is thus a need for providing vertical transistors in which the variation in gate length, spacer thickness and source/drain extension doping profile are well controlled. Notably, an optimized source/drain extension region can provide performance benefits to semiconductor structures containing vertical transistors.

SUMMARY

A semiconductor structure including vertical transistors is provided in which a sigma shaped source/drain extension region is formed between a top faceted surface of a first region of an epitaxial semiconductor channel material and a bottom faceted surface of a second region of the epitaxial semiconductor channel material. The sigma shaped source/drain extension region is formed after formation of a functional gate structure on each side of an epitaxial semiconductor channel material by first removing a sacrificial bottom spacer layer of a bottom spacer material stack, performing a sigma shape producing etch on an exposed lower portion of the epitaxial semiconductor channel material to provide the first region of epitaxial semiconductor channel material and the second region of the epitaxial semiconductor channel material, and then epitaxially growing the sigma shaped source/drain extension region from the faceted surfaces of the first and second regions of epitaxial semiconductor channel material. The sigma shaped source/drain extension region can be optimized to provide performance benefits.

In one aspect of the present application, a semiconductor structure is provided. In one embodiment of the present application, the semiconductor structure may include a bottom source/drain semiconductor material layer located above a base semiconductor substrate. An epitaxial semiconductor channel material structure extends upward from a topmost surface of the bottom source/drain semiconductor material layer. The epitaxial semiconductor channel material structure comprises, from bottom to top, a first region of an epitaxial semiconductor channel material having a faceted top surface, a second region of the epitaxial semiconductor channel material having a bottom faceted surface, and a third region of the epitaxial semiconductor channel material. A functional gate structure is located on each side of the epitaxial semiconductor channel structure. A top source/drain structure extends outward from each sidewall of the third region of the epitaxial semiconductor channel material. A sigma shaped source/drain extension region is present between, and in contact with, the top faceted surface of the first region of the epitaxial semiconductor channel material and the bottom faceted surface of the second region of the epitaxial semiconductor channel material.

In another aspect of the present application, a method of forming a semiconductor structure is provided. In one embodiment of the present application, the method may include forming a material stack on a base semiconductor substrate, the material stack comprising a bottom source/drain semiconductor material layer, a bottom spacer material stack, a sacrificial gate material layer, a top spacer layer, and a hard mask layer, the bottom spacer material stack comprises, from bottom to top, a first bottom spacer layer, a second bottom spacer layer and a third bottom spacer layer. An opening is the formed in the material stack to expose a portion of the bottom source/drain semiconductor material layer. An epitaxial semiconductor channel material is formed extending upward from the exposed portion of the bottom source/drain semiconductor material layer. Next, the remaining portions of the hard mask layer are removed, and thereafter a top source/drain structure is formed extending outward from each sidewall of an upper portion of the epitaxial semiconductor channel material. Remaining portions of the top spacer layer and the sacrificial gate material layer are then removed to expose a lower portion of the epitaxial semiconductor channel material. A functional gate structure is then formed on each side of the lower portion of the epitaxial semiconductor channel material. Next, the entirety of the second bottom spacer layer is removed to provide a cavity that exposes a portion of the lower portion of the epitaxial semiconductor channel material. A sigma shape producing etch is then performed on the exposed portion of the lower portion of the epitaxial semiconductor channel material to provide a first region of the epitaxial semiconductor channel material having a top faceted surface and a second region of the epitaxial semiconductor channel material having a faceted bottom surface. Next, a sigma shaped source/drain extension region is formed between, and in contact with, the top faceted surface of the first region of the epitaxial semiconductor channel material and the bottom faceted surface of the second region of the epitaxial semiconductor channel material.

DETAILED DESCRIPTION

Figure 1:
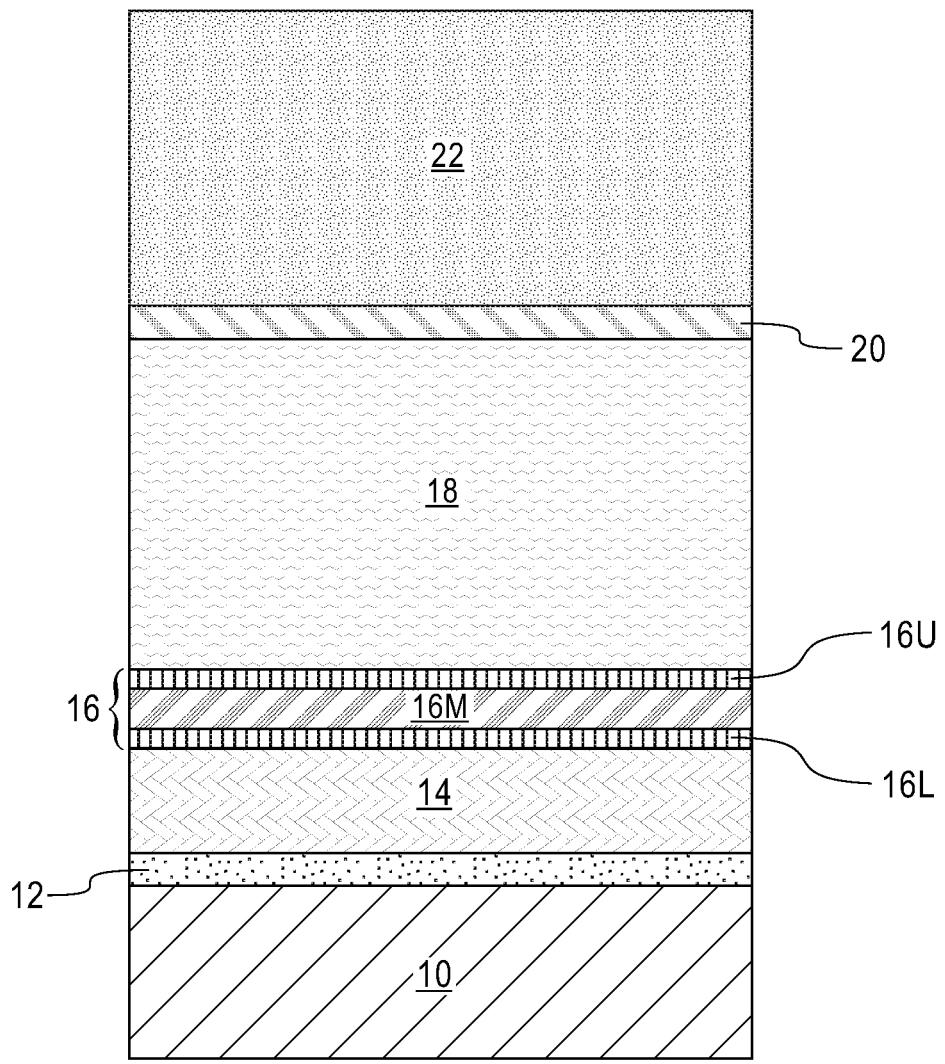
FIG. 1 is a cross sectional view of an exemplary semiconductor structure including a material stack of, from bottom to top, a semiconductor material layer of a first conductivity type, a bottom source/drain semiconductor material layer of a second conductivity type that is opposite the first conductivity type, a bottom spacer material stack, a sacrificial gate material layer, a top spacer layer, and a hard mask layer, the material stack is located on a base semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure of FIG. 1 includes a material stack of, from bottom to top, a semiconductor material layer 12 of a first conductivity type, a bottom source/drain semiconductor material layer 14 of a second conductivity type that is opposite the first conductivity type, a bottom spacer material stack 16, a sacrificial gate material layer 18, a top spacer layer 20, and a hard mask layer 22. The material stack (12, 14, 16, 18, 20, 22) is located on a base semiconductor substrate 10. In some embodiments, the semiconductor material layer 12 may be omitted.

The base semiconductor substrate 10 may include at least one semiconductor material having semiconducting properties. Examples of semiconductor materials that may provide at least a portion of the base semiconductor substrate 10 include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the base semiconductor substrate 10 is a bulk semiconductor substrate. By "bulk" it is meant that the semiconductor substrate is entirely composed of at least one semiconductor material, as defined above. In one example, the base semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the base semiconductor substrate 10 may comprise a topmost semiconductor material layer of a semiconductor-on-insulator (SOI) substrate. The SOI substrate would also include a handle substrate (not shown) including one of the above mentioned semiconductor materials, and an insulator layer (not shown) such as a buried oxide below the topmost semiconductor material layer.

In any of the above embodiments, the semiconductor material that provides the base semiconductor substrate 10 may be a single crystalline semiconductor material. The semiconductor material that provides the base semiconductor substrate 10 may have any of the well known crystal orientations. For example, the crystal orientation of the base semiconductor substrate 10 may be {100}, {110}, or {111}. Other crystallographic orientations besides those specifically mentioned can also be used in the present application.

The semiconductor material layer 12 of the first conductivity type may include one of the semiconductor materials mentioned above for providing the base semiconductor substrate 10. In one embodiment, the semiconductor material layer 12 may be composed of a same semiconductor material as the base semiconductor substrate 10. For example, the base semiconductor substrate 10 and the semiconductor material layer 12 may be composed of silicon. In yet another embodiment, the semiconductor material layer 12 may be composed of a different semiconductor material than the semiconductor base substrate 10. For example, the base semiconductor substrate 10 may be composed of silicon, while the semiconductor material layer 12 may be composed of a silicon germanium alloy or germanium.

The first conductivity type of the semiconductor material layer 12 may be provided by a p-type or n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment of the present application, the concentration of n-type or p-type dopant within the semiconductor material layer 12 can range from $5\times10^{18}$ atoms/cm$^3$ to $5\times10^{19}$ atoms/cm$^3$, although dopant concentrations greater than or lesser than this range are also conceived. In one embodiment, the doping within the semiconductor material layer 12 may be uniform (i.e., have a uniform distribution of dopants throughout the entire region). In another embodiment, the doping within the semiconductor material layer 12 may be graded. The semiconductor material layer 12 is oppositely doped to the bottom source/drain semiconductor material layer 14 so as to act as a punch through stop layer.

In one embodiment of the present application, the semiconductor material layer 12 may have a thickness from 50 nm to 200 nm. Other thicknesses that are lesser than, or greater than, the aforementioned thickness range may also be employed in the present application as the thickness of the semiconductor material layer 12.

The bottom source/drain semiconductor material layer 14 of the second conductivity type may include one of the semiconductor materials mentioned above for providing the base semiconductor substrate 10. In one embodiment, the bottom source/drain semiconductor material layer 14 may be composed of a same semiconductor material as the semiconductor material layer 12 and the base semiconductor substrate 10. For example, the base semiconductor substrate 10, the semiconductor material layer 12 and the bottom source/drain semiconductor material layer 14 may all be composed of silicon. In yet another embodiment, the bottom source/drain semiconductor material layer 14 may be composed of a different semiconductor material than at least one of the semiconductor base substrate 10 or the semiconductor material layer 12. For example, the base semiconductor substrate 10 may be composed of silicon, the semiconductor material layer 12 may be composed of silicon, and the bottom source/drain semiconductor material layer 14 may be composed of a silicon germanium alloy or germanium.

The second conductivity type of the bottom source/drain semiconductor material layer 14 may be provided by a p-type or n-type dopant, as defined above, with the proviso that the second conductivity type is opposite to the first conductivity type. In one example, and when the first conductivity type is n-type, then the second conductivity type is p-type. In another example, and when the first conductivity type is p-type, then the second conductivity type is n-type.

The concentration of n-type or p-type dopant within the bottom source/drain semiconductor material layer 14 is typically greater than the concentration of dopant present in the semiconductor material layer 12. In one example, the concentration of dopant within the bottom source/drain semiconductor material layer 14 can range from $1\times10^{20}$ atoms/cm$^3$ to $2\times10^{21}$ atoms/cm$^3$.

In one embodiment of the present application, the bottom source/drain semiconductor material layer 14 may have a thickness from 20 nm to 50 nm. Other thicknesses that are lesser than, or greater than, the aforementioned thickness range may also be employed in the present application as the thickness of the bottom source/drain semiconductor material layer 14.

In one embodiment of the present application, the base semiconductor substrate 10, the semiconductor material layer 12, and the bottom source/drain semiconductor material layer 14 are formed by first providing the base semiconductor substrate 10. An epitaxial growth (or deposition) process may then be employed to form the semiconductor material layer 12 and the bottom source/drain semiconductor material layer 14. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing semiconductor material layer 12 and bottom source/drain semiconductor material layer 14, semiconductor material layer 12 and bottom source/drain semiconductor material layer 14 have an epitaxial relationship with each other as well as topmost surface of the base semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth of semiconductor material layer 12 and bottom source/drain semiconductor material layer 14 can be performed utilizing any well known precursor gas or gas mixture. Carrier gases like hydrogen, nitrogen, helium and argon can be used. In some embodiments, a dopant that provides the specific conductivity type to the semiconductor material layer 12 and the bottom source/drain semiconductor material layer 14 may be introduced in-situ into the precursor gas or gas mixture that provides the semiconductor material layer 12 and/or the bottom source/drain semiconductor material layer 14. In another embodiment, a dopant that provides the specific conductivity type may be introduced into an intrinsic semiconductor material that can be used as semiconductor material layer 12 and/or bottom source/drain semiconductor material layer 14 by ion implantation or gas phase doping.

In another embodiment of the present application, the base semiconductor substrate 10, the semiconductor material layer 12, and the bottom source/drain semiconductor material layer 14 are formed by first providing the base semiconductor substrate 10. Dopants that provide the specific conductivity type of the semiconductor material layer 12 and/or bottom source/drain semiconductor material layer 14 may then be introduced into base semiconductor substrate 10 by ion implantation or gas phase doping.

In another embodiment of the present application, the base semiconductor substrate 10, the semiconductor material layer 12, and the bottom source/drain semiconductor material layer 14 can be formed utilizing one or more wafer bonding processes.

After providing the base semiconductor substrate 10, the semiconductor material layer 12, and the bottom source/drain semiconductor material layer 14, the bottom spacer material stack 16 is formed on a topmost surface of the bottom source/drain semiconductor material layer 14. The bottom spacer material stack 16 includes, from bottom to top, a first bottom spacer layer 16L, a second bottom spacer layer 16M and a third bottom spacer layer 16U. Each of the first bottom spacer layer 16L, the second bottom spacer layer 16M and the third bottom spacer layer 16U of the bottom spacer material stack 16 is composed of a dielectric material. In accordance with the present application, the second bottom spacer layer 16M is composed of a different dielectric material than either the first bottom spacer layer 16L or the third bottom spacer layer 16U. In some embodiments, the first and third bottom spacer layers (16L, 16U) of the bottom spacer material stack 16 are composed of a same dielectric material. In yet other embodiments, the third bottom spacer layer 16U is composed of a different dielectric material than the first bottom spacer layer 16L.

The dielectric material that may be used in providing the first bottom spacer layer 16L, the second bottom spacer layer 16M and the third bottom spacer layer 16U of the bottom spacer material stack 16 may be silicon dioxide, silicon nitride and/or silicon oxynitride, with the proviso that the dielectric material that provides the second bottom spacer layer 16M is different from the dielectric materials that provide the first and third bottom spacer layers (16L, 16U) of the bottom spacer material stack 16. The bottom spacer material stack 16 including layers 16L, 16M, 16U can be formed by a deposition process such as, for example, chemical vapor deposition (CVD) or plasma enhanced chemical vapor deposition (PECVD). In other embodiments, the bottom spacer material stack 16 can be formed by a thermal process such as, for example, thermal oxidation and/or thermal nitridation. In yet other embodiments, the bottom spacer material stack 16 can be formed by a combination of a deposition process and a thermal process. The thickness of the bottom spacer material stack 16 can range from 4 nm to 20 nm. Other thicknesses that are lesser than, or greater than, the aforementioned thickness range may also be employed as the thickness of the bottom spacer material stack 16. In the present application, the second bottom spacer layer 16M of the bottom spacer material stack 16 may have a thickness that is greater than the thickness of either the first bottom spacer layer 16L or the third bottom spacer layer 16U of the bottom spacer material stack 16. In one embodiment, the second spacer layer 16M of the bottom spacer material stack 16 has a thickness from 5 nm to 15 nm.

Next, the sacrificial gate material layer 18 is formed on a topmost surface of bottom spacer material stack 16. The sacrificial gate material layer 18 may include a material such as, for example, polysilicon or amorphous silicon. The sacrificial gate material layer 18 can be formed utilizing a deposition process including, for example, chemical vapor deposition (CVD), plasma enhanced chemical vapor deposition (PECVD), physical vapor deposition (PVD), sputtering, or atomic layer deposition (ALD). The thickness of the sacrificial gate material layer 18 can range from 50 nm to 200 nm. Other thicknesses that are lesser than, or greater than, the aforementioned thickness range may also be employed as the thickness of the sacrificial gate material layer 18.

The top spacer layer 20 is then formed on a topmost surface of the sacrificial gate material layer 18. The top spacer layer 20 may include one of the dielectric materials mentioned above for the bottom spacer material stack 16. The top spacer layer 20 may be formed utilizing one of the deposition processes mentioned above for forming the bottom spacer material stack 16. The top spacer layer 20 may have a thickness that is within the thickness range mentioned above for the bottom spacer material stack 16.

Next, the hard mask layer 22 is formed on the topmost surface of the top spacer layer 20. The hard mask layer 22 is a contiguous hard mask material that covers the entirety of the top spacer layer 20. The hard mask layer 22 that is employed in the present application may include an oxide, a nitride and/or an oxynitride, with the proviso that the hard mask layer 22 has a different etch rate than the underlying top spacer layer 20. In one example, the hard mask layer 22 may be composed of silicon dioxide, while the top spacer layer 20 may be composed of silicon nitride. The hard mask layer 22 can be formed utilizing a deposition process such as described above in forming the bottom spacer layer 16. The thickness of the hard mask layer 22 can range from 20 nm to 150 nm. Other thicknesses that are lesser than, or greater than, the aforementioned thickness range may also be employed as the thickness of the hard mask layer 22.

Figure 2:
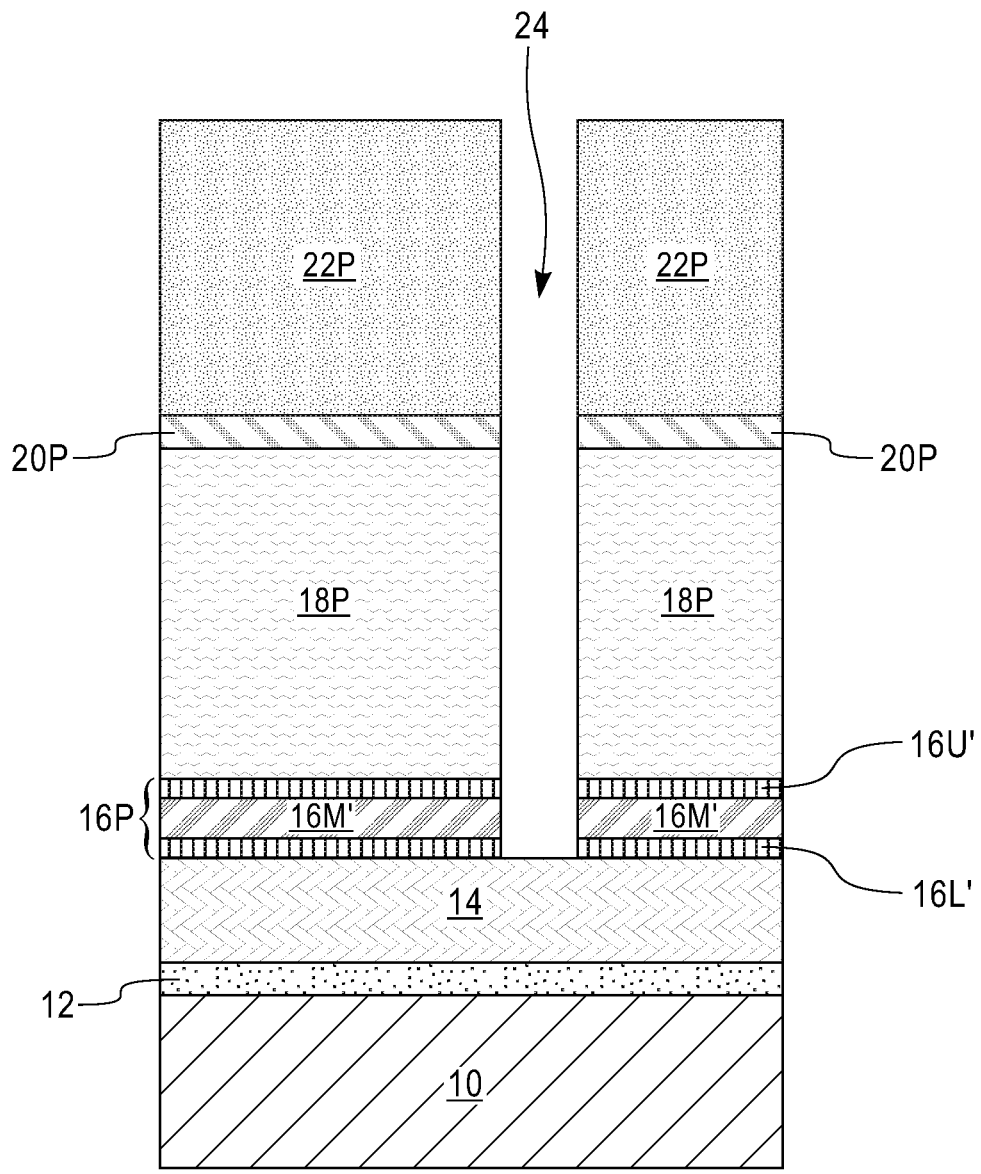
FIG. 2 is a cross sectional view of the exemplary semiconductor structure of FIG. 1 after forming an opening in the material stack which exposes a portion of a topmost surface of the bottom source/drain semiconductor material layer.

Referring now to FIG. 2, there is illustrated the exemplary semiconductor structure of FIG. 1 after forming an opening 24 in the material stack which exposes a portion of a topmost surface of the source/drain semiconductor material layer 14. Although a single opening 24 is described and illustrated, a plurality of openings can be formed in different portions of the material stack. These other openings may be present in a same device region as opening 24, and/or they may be present in other device regions.

Opening 24 extends through the hard mask layer 22, the top spacer layer 20, the sacrificial gate material layer 18 and the bottom spacer material stack 16. Opening 24 exposes a portion of the topmost surface of the bottom source/drain semiconductor material layer 14.

Opening 24 may be formed by utilizing any well known patterning process. In one embodiment of the present application, the patterning process used to define opening 24 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing one or more etching process. Typically, the one or more etching processes include an anisotropic etch such as, for example, reactive ion etching.

In another embodiment, the patterning process used to define opening 24 may include a sidewall image transfer (SIT) process. In yet another embodiment, the patterning process used to define opening 24 may include a direct self-assembly (DSA) patterning process. In each of SIT and DSA, one or more anisotropic etching process can be employed.

Opening 24 that is formed can have a width from 4 nm to 12 nm. The width of opening 24 will determine the width of the channel material to be subsequently formed therein. Other widths that are lesser than or greater than the aforementioned width range may also be employed in the present application.

After forming the opening 24, portions of the hard mask layer 22, the top spacer layer 20, the sacrificial gate material layer 18, and the bottom spacer material stack 16 remain laterally surrounding opening 24. Each remaining portion of the hard mask layer 22 may be referred to herein as a hard mask portion 22P, each remaining portion of the top spacer layer 20 may be referred to herein as top spacer portion 20P, each remaining portion of the sacrificial gate material layer 18 may be referred to herein as a sacrificial gate material portion 18P, each remaining portion of the first bottom spacer layer 16L of the bottom spacer material stack 16 may be referred to herein as a first bottom spacer portion 16L', each remaining portion of the second bottom spacer layer 16M of the bottom spacer material stack 16 may be referred to herein as a second bottom spacer portion 16M', and each remaining portion of the third bottom spacer layer 16U of the bottom spacer material stack 16 may be referred to herein as a third bottom spacer portion 16U'. The remaining portions of the bottom spacer material stack 16 may be referred to herein as a bottom spacer material stack portion 16P.

Figure 3:
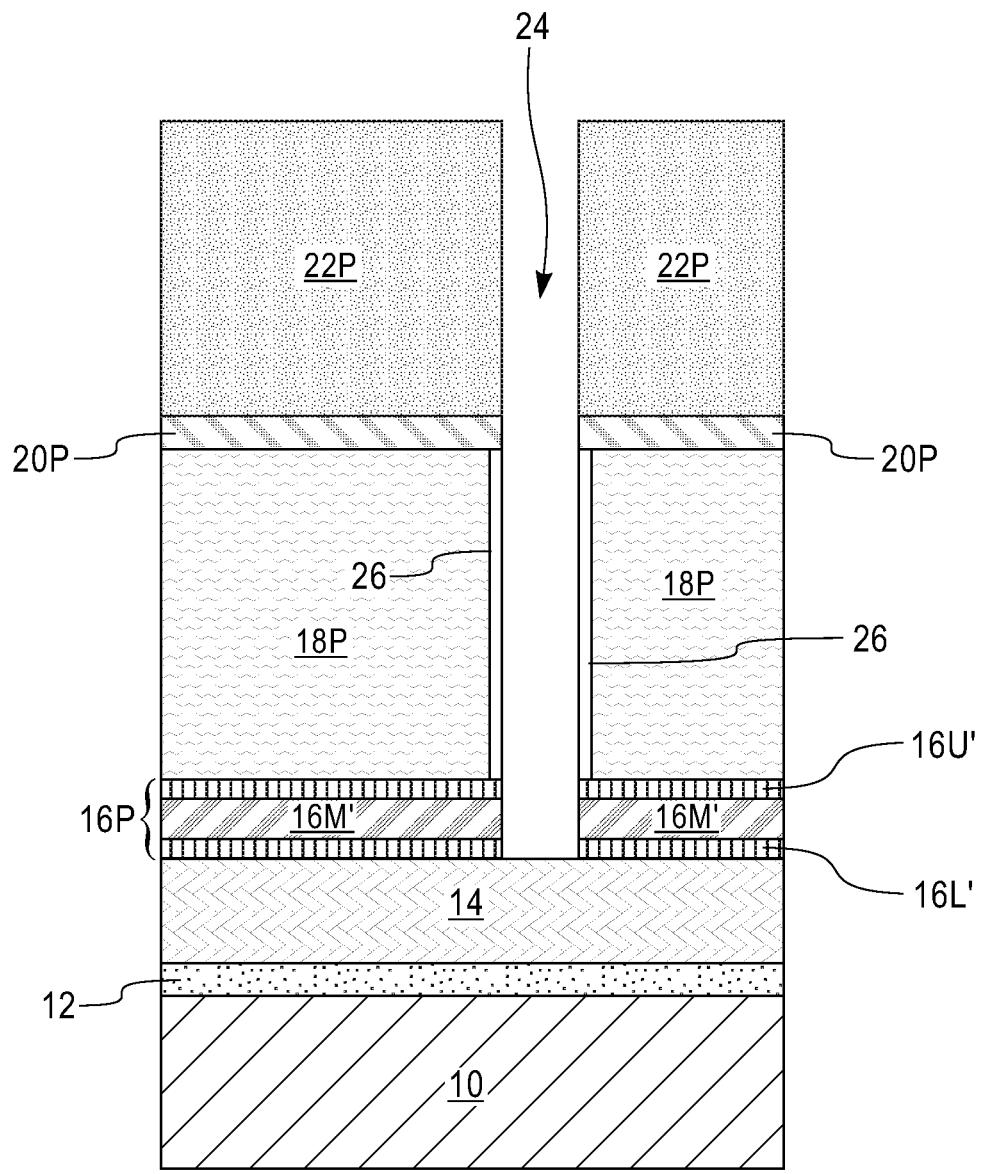
FIG. 3 is a cross sectional view of the exemplary semiconductor structure of FIG. 2 after forming an oxide liner into exposed sidewalls of each remaining portion of the sacrificial gate material layer in the opening.

Referring now to FIG. 3, there is illustrated the exemplary semiconductor structure of FIG. 2 after forming an oxide liner 26 into exposed sidewalls of each remaining portion of the sacrificial gate material layer (i.e., each sacrificial gate material portion 18P) in the opening 24. The oxide liner 26 can be formed utilizing an oxidation process such as, for example, a plasma oxidation process, thermal oxidation process or a chemical oxidation process. The oxidation process used to form the oxide liner 26 converts the exposed portion of each sacrificial gate material portion 18P into the oxide liner 26. The oxide liner 26 that is formed thus has a sidewall surface that is vertically aligned to the sidewall surfaces of each hard mask portion 22P, each top spacer portion 20P, and each of the remaining layers (i.e., 16L', 16M', 16U') of the bottom spacer material stack portion 16P.

Figure 4:
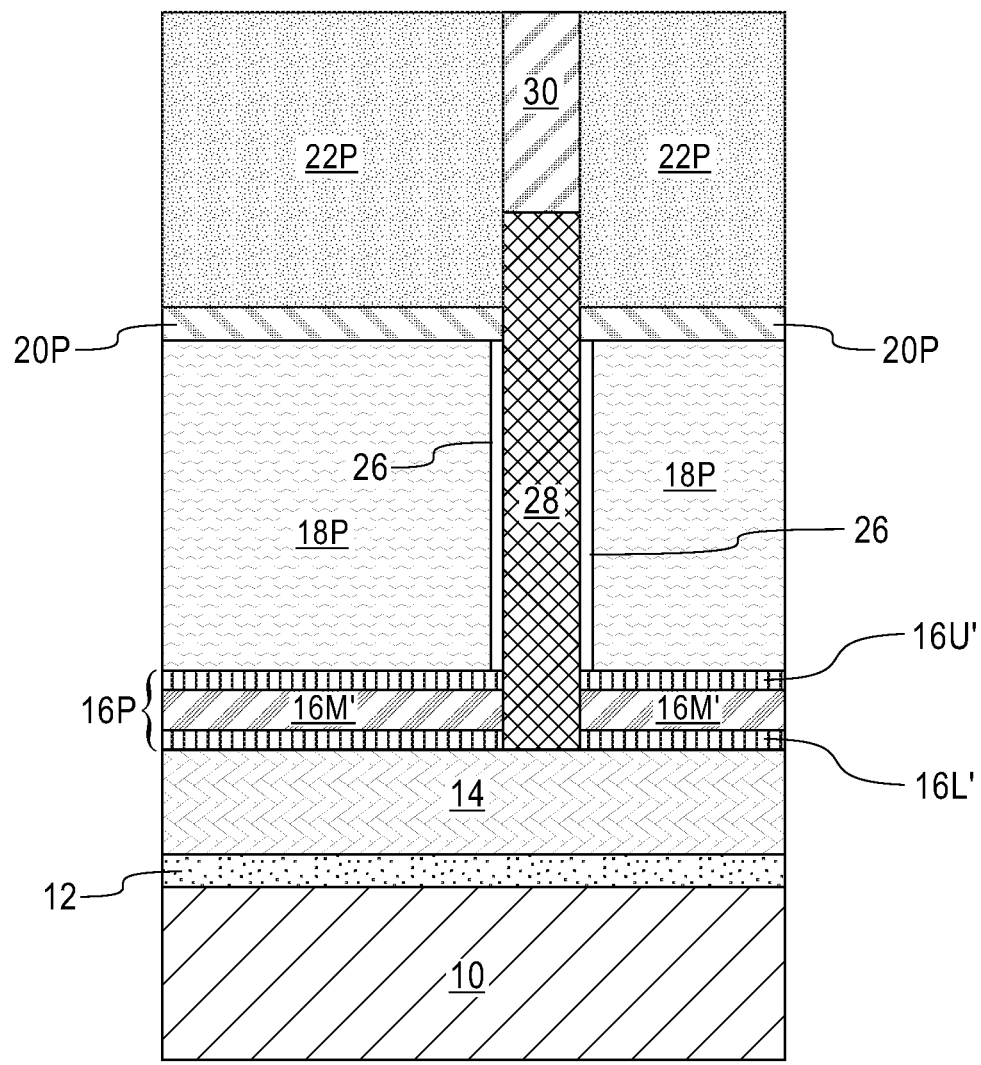
FIG. 4 is a cross sectional view of the exemplary semiconductor structure of FIG. 3 after forming an epitaxial semiconductor channel material in a portion of the opening and forming a dielectric cap on the epitaxial semiconductor channel material.

Referring now to FIG. 4, there is illustrated the exemplary semiconductor structure of FIG. 3 after forming an epitaxial semiconductor channel material 28 in a portion of the opening 24 and forming a dielectric cap 30 on the epitaxial semiconductor channel material 28.

The epitaxial semiconductor channel material 28 may include one of the semiconductor materials mentioned above for the base semiconductor substrate 10. In some embodiments, the semiconductor material that provides the epitaxial semiconductor channel material 28 may be composed of a same semiconductor material as the bottom source/drain semiconductor material layer 14. For example, the epitaxial semiconductor channel material 28 and the bottom source/drain semiconductor material layer 14 may both be composed of silicon. In another embodiment, the epitaxial semiconductor channel material 28 may be composed of a different semiconductor material than the bottom source/drain semiconductor material layer 14. For example, the epitaxial semiconductor channel material 28 may be composed of a high mobility channel material such as, for example, germanium, a silicon germanium alloy or a III-V compound semiconductor, while the bottom source/drain semiconductor material layer 14 may be composed of silicon.

The epitaxial semiconductor channel material 28 may be doped or undoped. When doped, the dopant that is present in the epitaxial semiconductor channel material 28 is of a same conductivity type (i.e., first conductivity type) as the semiconductor material layer 12. When doped, the dopant concentration in the epitaxial semiconductor channel material 28 may be from $1 \times 10^{15}$ atoms/cm$^3$ to $2 \times 10^{18}$ atoms/cm$^3$.

The epitaxial semiconductor channel material 28 may be formed utilizing an epitaxial growth (or deposition) process as defined above, followed by a recess etch. If doped, the dopant can be introduced during the epitaxial growth of the epitaxial semiconductor channel material 28. An optional planarization process such as, for example, chemical mechanical polishing (CMP), may be employed between the epitaxial growth and recess etch step. The recess etch employed is selective in removing the semiconductor material that provides the epitaxial semiconductor channel material 28. In one embodiment, recessing may be performed utilizing a timed reactive ion etch. The epitaxial semiconductor channel material 28 that is formed has a topmost surface that is located between the topmost surface and the bottommost surface of each hard mask portion 22P.

Dielectric cap 30 is then formed on a topmost surface of the epitaxial semiconductor channel material 28. The dielectric cap 30 has a different etch rate than the hard mask material that provides the hard mask layer 22. Hence, the dielectric cap 30 is composed of a different dielectric material than hard mask layer 22. In one example, the dielectric cap 30 may be composed of silicon nitride, while the hard mask layer 22 may be composed of silicon dioxide.

The dielectric cap 30 can be formed utilizing a deposition process such as, for example, chemical vapor deposition or plasma enhanced chemical vapor deposition. A planarization process such as, for example, chemical mechanical polishing (CMP), may follow the deposition of the dielectric material that provides the dielectric cap 30. As is shown, sidewall surfaces of the dielectric cap 30 are vertically aligned with the sidewall surfaces of the underlying epitaxial semiconductor channel material 28.

Figure 5:
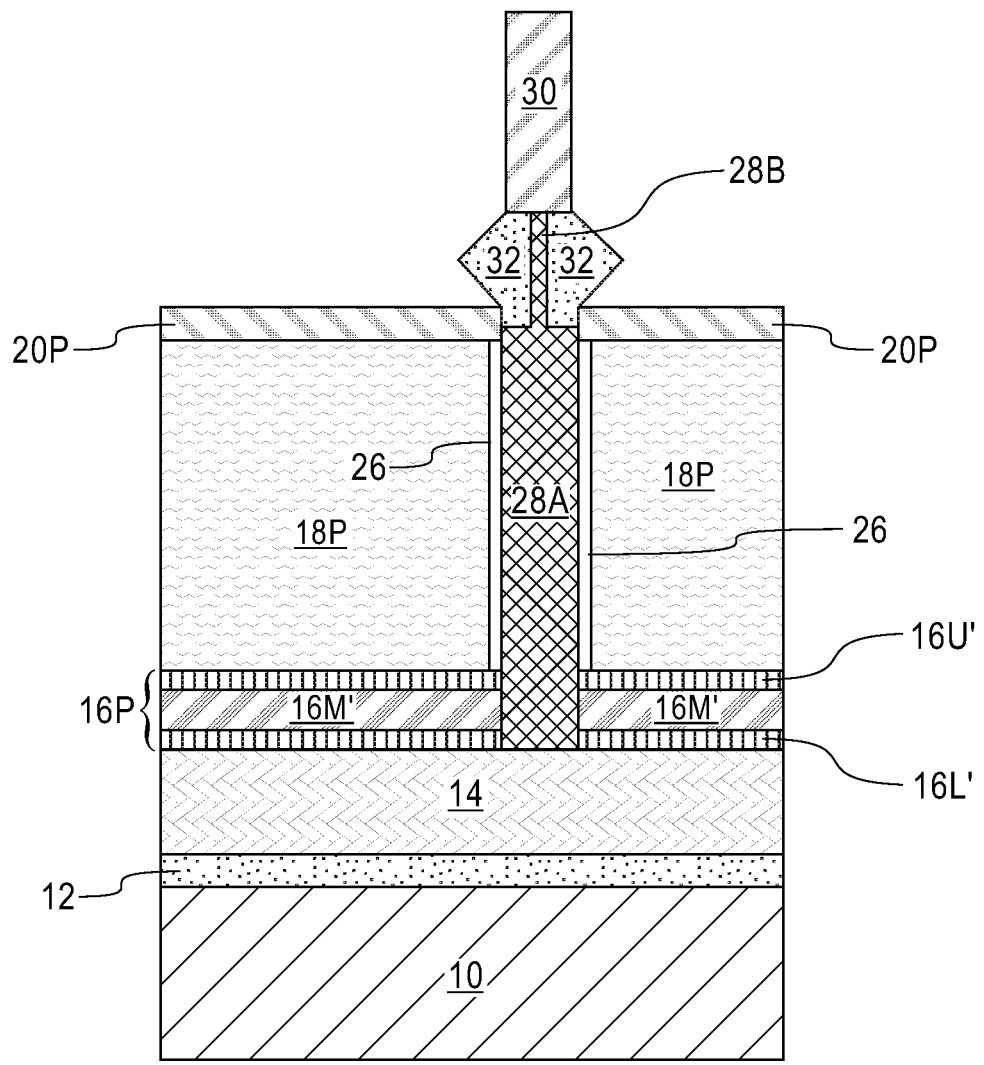
FIG. 5 is a cross sectional view of the exemplary semiconductor structure of FIG. 4 after removing remaining portions of the hard mask layer, laterally etching an exposed portion of the epitaxial semiconductor channel material, and epitaxially growing a top source/drain structure from each recessed sidewall of an upper portion of the epitaxial semiconductor channel material.

Referring now to FIG. 5, there is illustrated the exemplary semiconductor structure of FIG. 4 after removing remaining portions of the hard mask layer (i.e., each hard mask portion 22), laterally etching an exposed portion of the epitaxial semiconductor channel material 28, and epitaxially growing a top source/drain structure 32 from each recessed sidewall of an upper portion 28B of the epitaxial semiconductor channel material 28.

Each hard mask portion 22P may be removed utilizing an etching process that is selective in removing the hard mask material that provides the hard mask layer 22 stopping on each top spacer portion 20P. In one example, and when the hard mask portions 22P are composed of silicon dioxide, aqueous hydrofluoric acid may be employed as an etchant. The removal of each hard mask portion 22P exposes an upper portion of the epitaxial semiconductor channel material 28. The exposed upper portion of the epitaxial semiconductor channel material 28 is then subjected to a lateral etch (i.e., recessing) process to provide an upper portion 28B of the epitaxial semiconductor channel material 28 whose width is less than the non-etched portion (i.e., lower portion 28A) of the epitaxial semiconductor channel material 28.

Next, the top source/drain structure 32 is epitaxially grown from each exposed sidewall surface of the upper portion 28B of the epitaxial semiconductor channel material 28. The epitaxial growth (or deposition) used to provide each top source/drain structure 32 is as defined above. Each top source/drain structure 32 includes a semiconductor material and a dopant (n-type or p-type) as defined above. The dopant, which is of the same conductivity type as the bottom source/drain semiconductor material layer 14, can be added during the epitaxial growth of the semiconductor material that provides each top source/drain structure 32 or after epitaxially depositing an intrinsic semiconductor material utilizing a gas phase doping process. The dopant can be present in each top source/drain structure 32 in a range as mentioned above for the bottom source/drain semiconductor material layer 14. The semiconductor material that provides the each top source/drain structure 32 may be the same as, or different from, the semiconductor material that provides the epitaxial semiconductor channel material 28.

In some embodiments, and as shown, each top source/drain structure 32 may have faceted surfaces, i.e., non-planar surfaces. In some embodiments and as shown, each top source/drain structure 32 is triangular in shape, wherein the base of the triangle directly contacts one of the sidewalls of the upper portion 28B of the epitaxial semiconductor channel material 28 and the tip of the triangle extends outward from the one sidewall of the upper portion 28B of the epitaxial semiconductor channel material 28. In some embodiments, and as shown, the tip of each triangle may extend beyond the sidewall surfaces of the epitaxial semiconductor channel material 28.

During the epitaxial growth process and as shown, a portion of each top source/drain structure 32 may contact an exposed topmost surface of the lower portion 28A of the epitaxial semiconductor channel material 28; epitaxial growth is prevented from the topmost surface of the upper portion 28B of the epitaxial semiconductor channel material 28 due to the presence of the dielectric cap 30.

Figure 6:
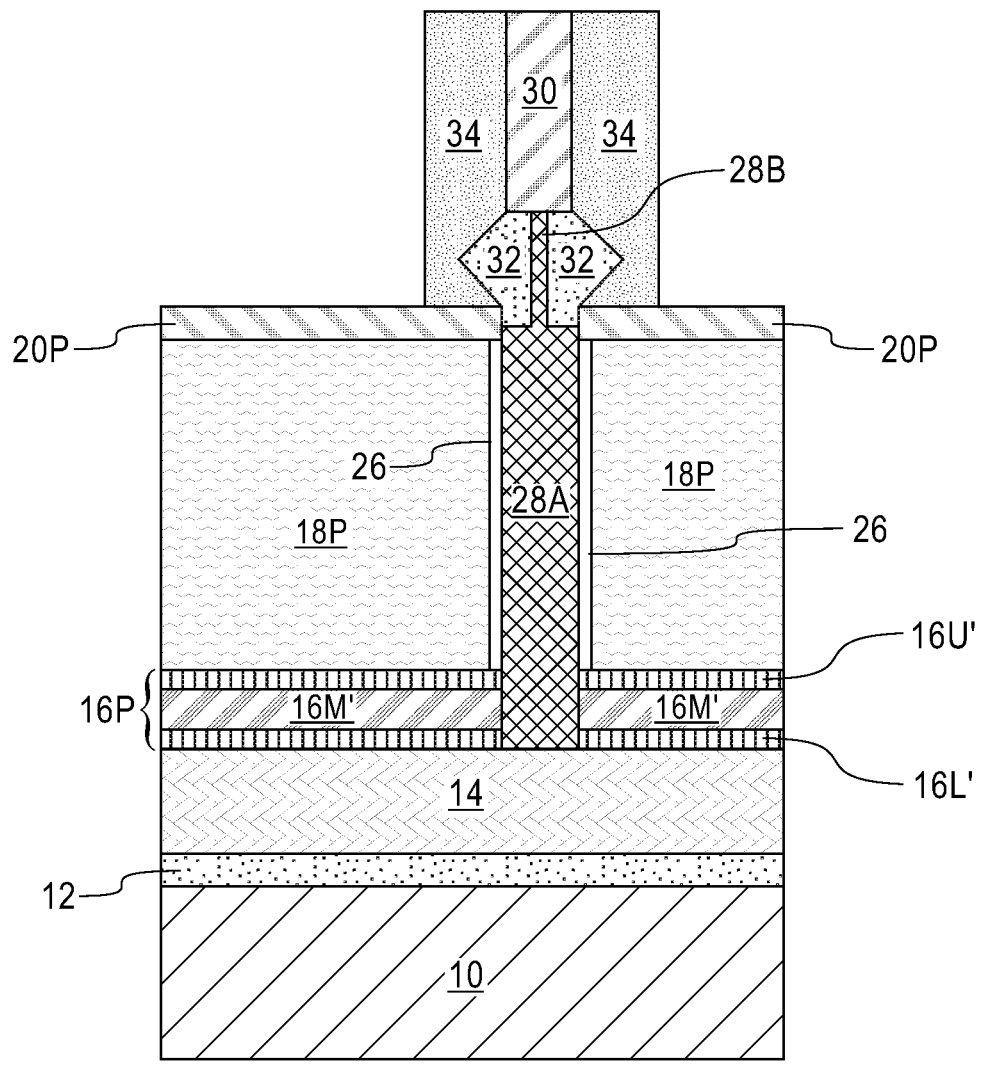
FIG. 6 is a cross sectional view of the exemplary semiconductor structure of FIG. 5 after forming a dielectric spacer protecting each top source/drain structure.

Referring now to FIG. 6, there is illustrated the exemplary semiconductor structure of FIG. 5 after forming a dielectric spacer 34 protecting each top source/drain structure 32. Each dielectric spacer 34 may include any dielectric spacer material including, for example, silicon dioxide, silicon nitride and/or silicon oxynitride. The dielectric spacer material that provides the dielectric spacer 34 is composed of a different material than at least the top spacer layer 20. Each dielectric spacer 34 may be formed utilizing a deposition process, followed by a spacer etch.

Figure 7:
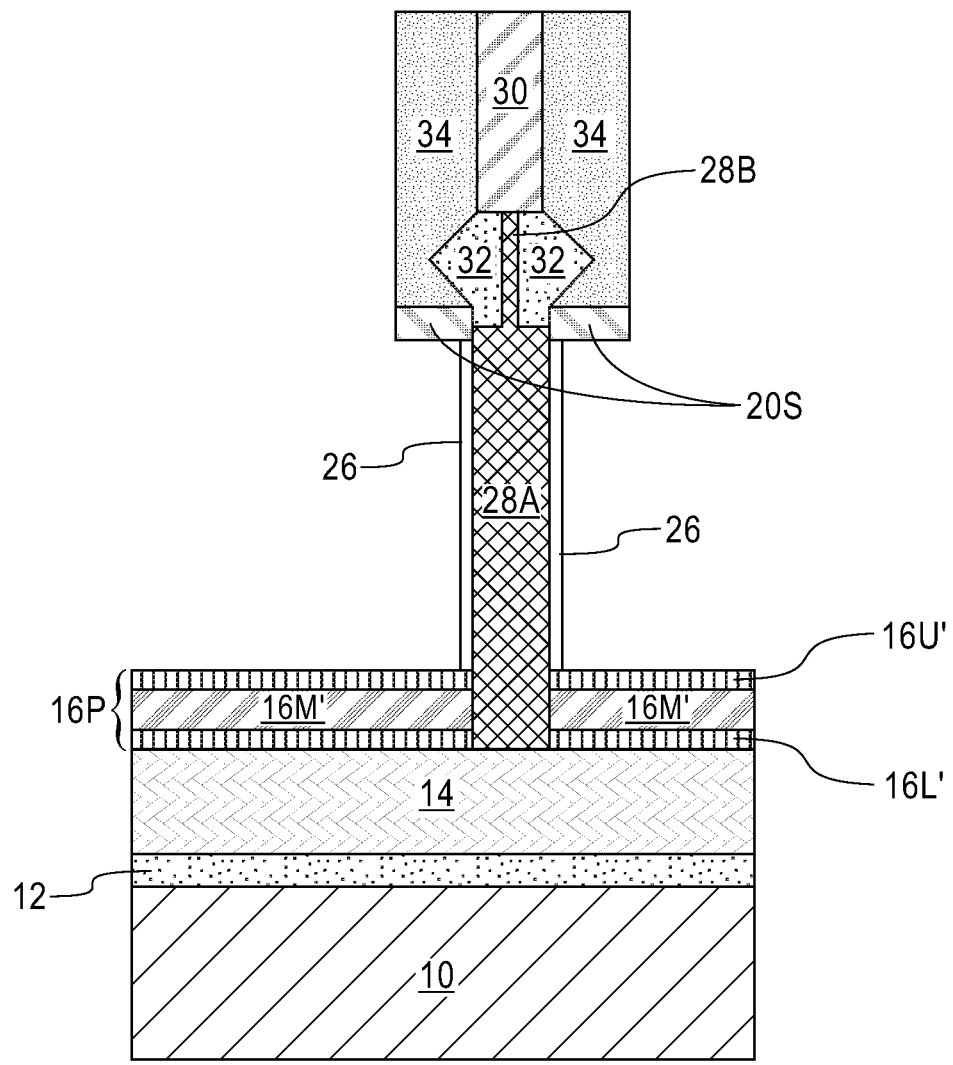
FIG. 7 is a cross sectional view of the exemplary semiconductor structure of FIG. 6 after removing each top spacer portion that is not protected by the dielectric spacer and then removing remaining portions of the sacrificial gate material layer.

Referring now to FIG. 7, there is illustrated the exemplary semiconductor structure of FIG. 6 after removing each top spacer portion 20P that is not protected by the dielectric spacer 34 and then removing remaining portions of the sacrificial gate material layer (i.e., each gate dielectric material portion 18P).

The removal of the top spacer portion 20P that is not protected by the dielectric spacer 34 can be performed utilizing an anisotropic etch. As is shown, portions of each top spacer portion 20P remain beneath each dielectric spacer 34. Each remaining portion of the top spacer portion 20P may be referred to herein as a top spacer structure 20S. As is shown, an outermost sidewall surface of each top spacer structure 20S is vertically aligned to the outermost sidewall surface of the overlying dielectric spacer 34.

The sacrificial gate material portions 18P may be removed utilizing a single etching process or a combination of etching processes may be used. The removal of each sacrificial gate material portion 18P exposes a topmost surface of each bottom spacer portion 16P and an outer sidewall of the oxide liner 26.

Figure 8:
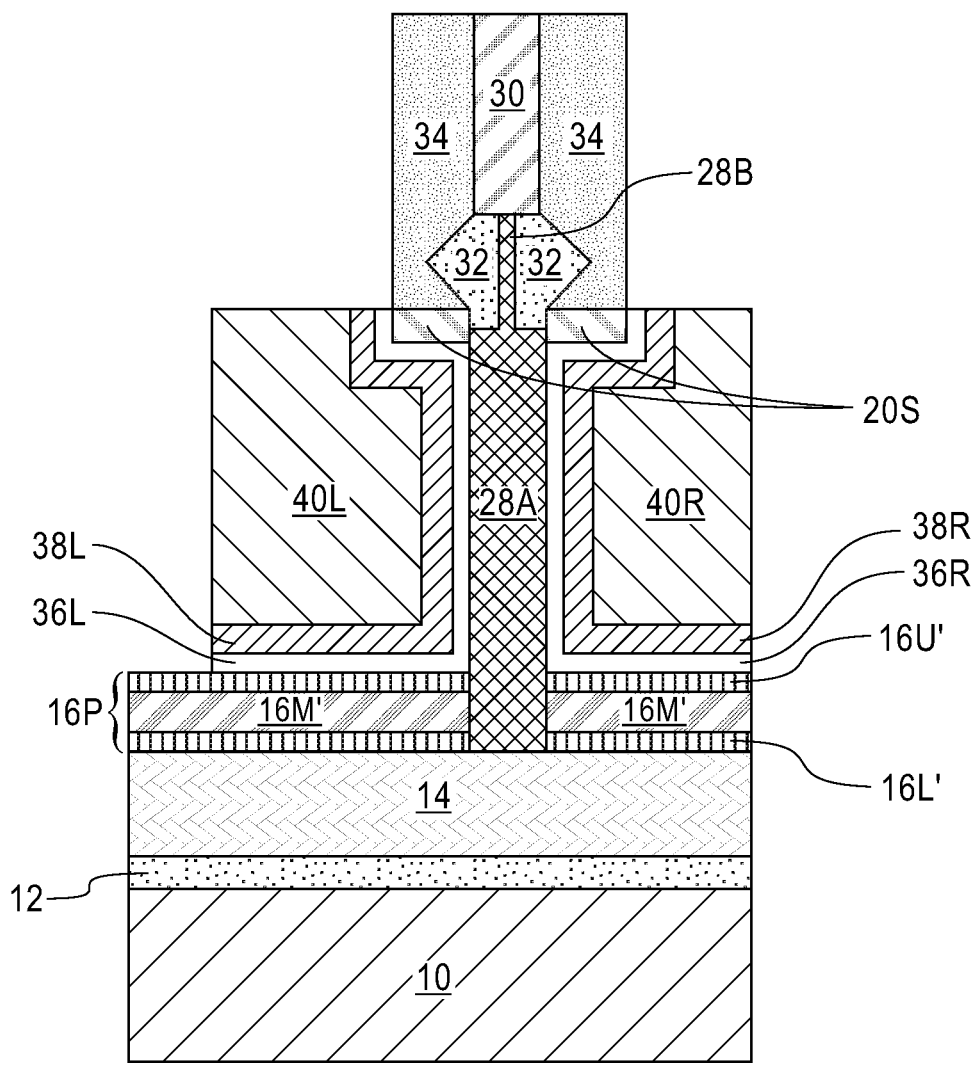
FIG. 8 is a cross sectional view of the exemplary semiconductor structure of FIG. 7 after removing the oxide liner from each sidewall of a lower portion of the epitaxial semiconductor channel material, and forming a functional gate structure on each side of the epitaxial semiconductor channel material.

Referring now to FIG. 8, there is illustrated the exemplary semiconductor structure of FIG. 7 after removing the oxide liner 26 from each sidewall of the lower portion 28A of the epitaxial semiconductor channel material 28, and forming a functional gate structure on each side of the epitaxial semiconductor channel material 28.

The removal of the oxide liner 26 may be performed utilizing an etching process that is selective in removing the oxide liner 26. In one embodiment of the present application, the oxide liner 26 may be removed utilizing aqueous hydrofluoric acid as an etchant. The removal of the oxide liner 26 exposes the sidewall surfaces of the lower portion 28A of the epitaxial semiconductor channel material 28.

By "functional gate structure" it is meant a permanent gate structure used to control output current (i.e., flow of carriers in the channel) of a semiconducting device through electrical or magnetic fields. Each functional gate structure includes a gate dielectric portion 36L, 36R, an inner gate conductor portion 38L, 38R, and an outer gate conductor portion 40L, 40R. In some embodiments, the inner gate conductor portion 38L, 38R can be omitted.

Each gate dielectric portion 36L, 36R is composed of a gate dielectric material such as, for example, a dielectric oxide, nitride, and/or oxynitride. In one example, the gate dielectric material that provides each gate dielectric portion 36L, 36R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material of each gate dielectric portion 36L, 36R. Gate dielectric portion 36L may comprise a same, or different gate dielectric material, as gate dielectric portion 36R. The gate dielectric material that provides each gate dielectric portion 36L, 36R can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that can provide each gate dielectric portion 36L, 36R can have a thickness in a range from 1 nm to 10 nm. Other thicknesses that are lesser than, or greater than, the aforementioned thickness range can also be employed for the gate dielectric material of each gate dielectric portion 36L, 36R.

Each inner gate conductor portion 38L, 38R, which is contact with a sidewall of a respective gate dielectric portion 36L, 36R, can include a gate conductor material. The gate conductor material used in providing each inner gate conductor portion 38L, 38R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Each inner gate conductor portion 38L, 38R may be composed of nFET gate metal or a pFET gate metal. The inner gate conductor portion 38L may comprise a same or different gate conductor material than the inner gate conductor portion 38R. The gate conductor material used in providing each inner gate conductor portion 38L, 38R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, inner gate conductor portion 38L, 38R can have a thickness from 50 nm to 200 nm. Other thicknesses that are lesser than, or greater than, the aforementioned thickness range can also be employed for the inner gate conductor portion 38L, 38R.

In the present application, a blanket layer of a gate dielectric material and a blanket layer of an inner gate conductor material are first formed and then patterned into gate dielectric portions 36L, 36R and inner gate conductor portions 38L, 38R.

Next, each outer gate conductor portion 40L, 40R is formed. Each outer gate conductor portion 40L, 40R comprises one of the conductor materials mentioned above for the inner gate conductor portions 38L, 38R. Typically, but not necessarily always, the outer gate conductor portion 40L, 40R comprises a different gate conductor material than the inner gate portion 38L, 38R. For example, each inner gate conductor portion 38L, 38R may include an nFET gate metal or a pFET gate metal and the outer gate conductor portion 40L, 40R may comprise polysilicon or an elemental metal such as tungsten. Each outer gate conductor portion 40L, 40R can be formed by first depositing an outer gate conductor material utilizing one of the deposition processes mentioned above in forming the inner gate conductor portion 38L, 38R. A planarization process such as, for example, CMP, may be employed after depositing the outer gate conductor material. The outer gate conductor material is then recessed. The recessing of the outer gate conductor material may be performed utilizing an etch back process that is selective in removing the outer gate conductor material. The recessed portion of the outer gate conductor material can then be patterned to provide the outer gate conductor portions 40L, 40R shown in FIG. 8. The patterning of each recessed second conductor material may be performed by lithography and etching as defined above.

Figure 9:
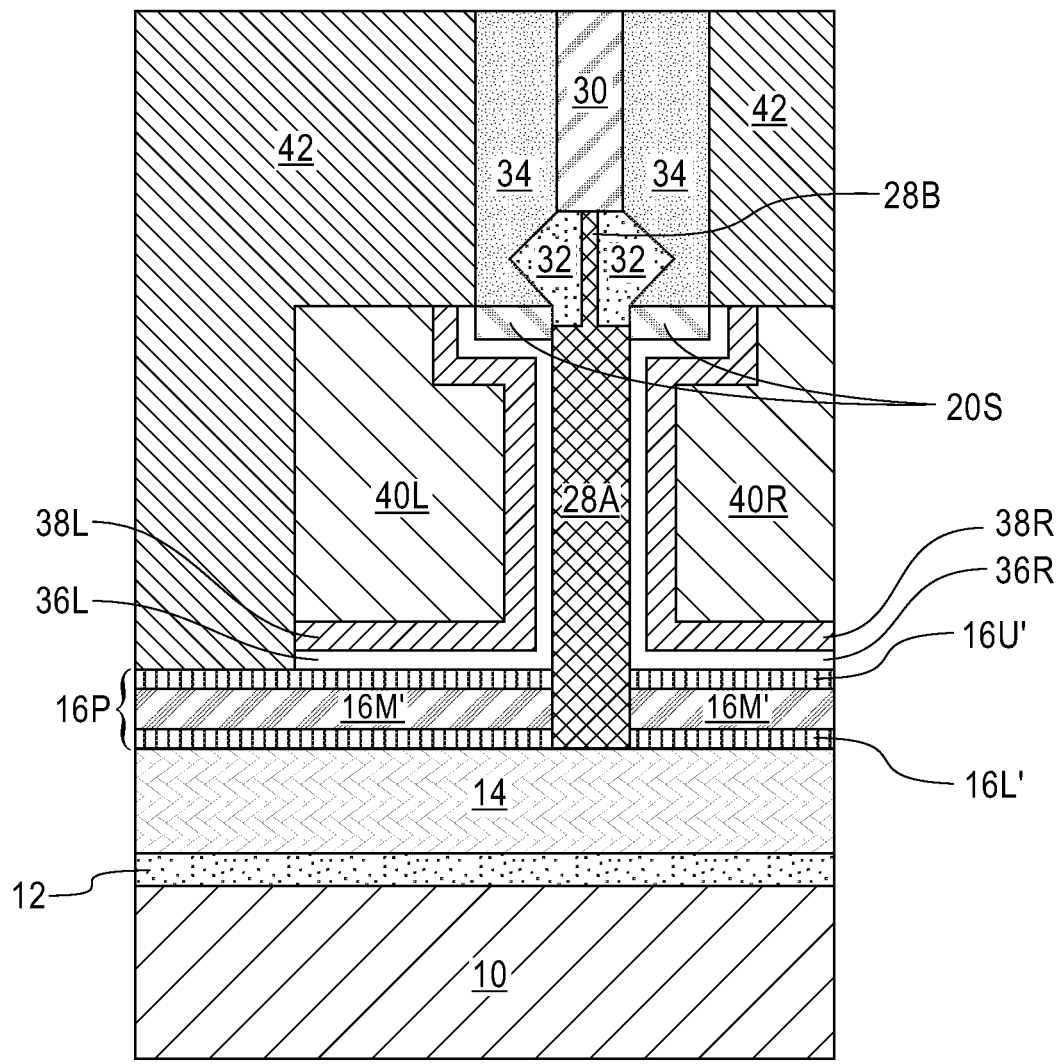
FIG. 9 is a cross sectional view of the exemplary semiconductor structure of FIG. 8 after forming a middle-of-the-line (MOL) dielectric material laterally surrounding each functional gate structure.

Referring now to FIG. 9, there is illustrated the exemplary semiconductor structure of FIG. 8 after forming a middle-of-the-line (MOL) dielectric material 42 laterally surrounding each functional gate structure. The MOL dielectric material 42 has a topmost surface that is coplanar with a topmost surface of the dielectric cap 30, as well as the topmost surface of each dielectric spacer 34.

The MOL dielectric material 42 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 42. The use of a self-planarizing dielectric material as the MOL dielectric material 42 may avoid the need to perform a subsequent planarizing step. In one embodiment, the MOL dielectric material 42 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 42, a planarization process or an etch back process follows the deposition of the dielectric material that provides the MOL dielectric material 42.

Figure 10:
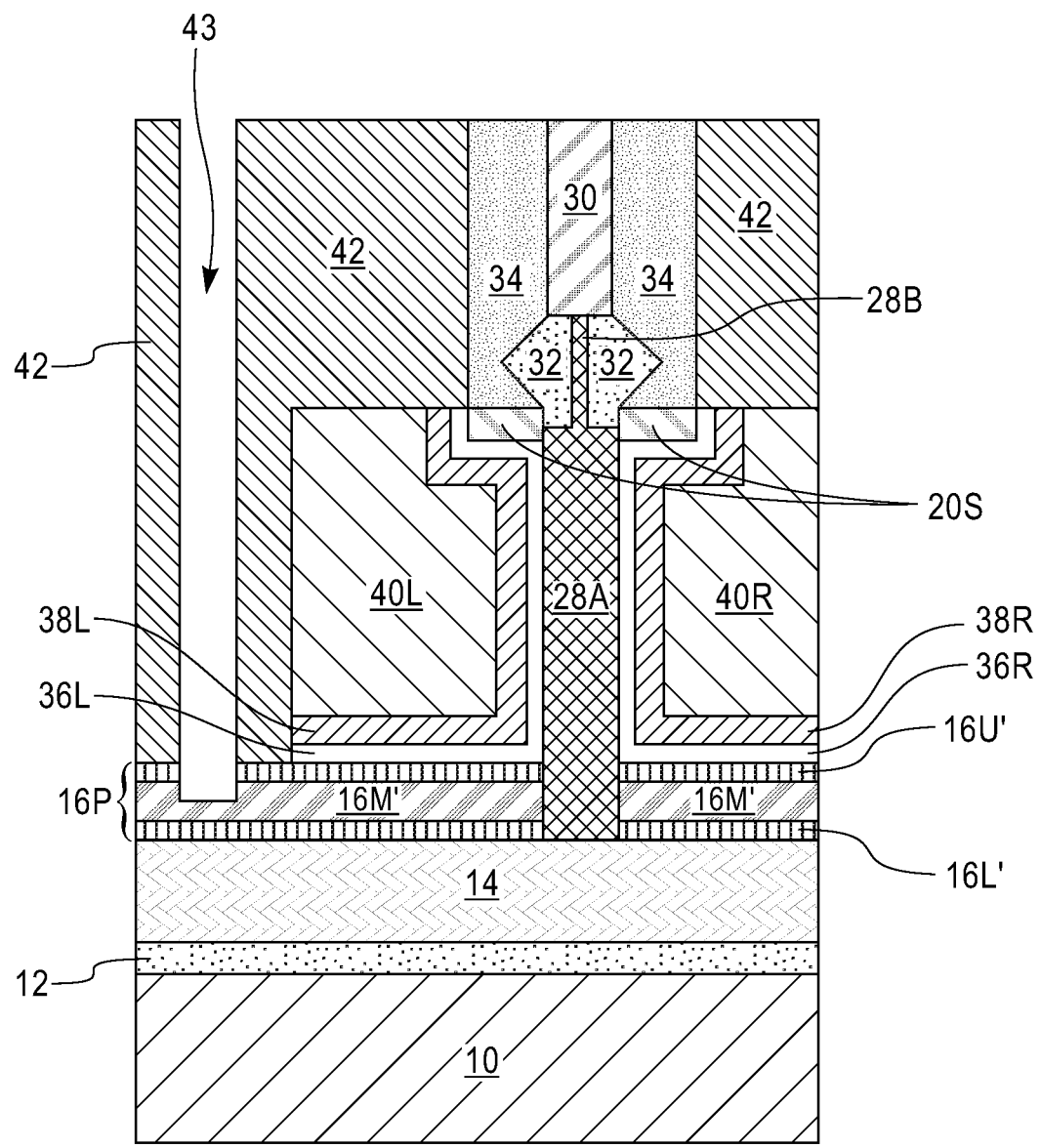
FIG. 10 is a cross sectional view of the exemplary semiconductor structure of FIG. 9 after forming an opening that extends entirely through the MOL dielectric material and into a remaining portion of a second bottom spacer layer of the bottom spacer material stack.

Referring now to FIG. 10, there is illustrated the exemplary semiconductor structure of FIG. 9 after forming an opening 43 that extends entirely through the MOL dielectric material 42 and into the second bottom spacer portion 16M' of the bottom spacer material stack portion 16P; opening 43 passes through the third bottom spacer portion 16U' but does not extend into the first bottom spacer portion 16L'. Opening 43 does not pass through any of the functional gate structures. The opening 43 can be formed by utilizing one of the patterning processes mentioned above for forming opening 24 in the material stack. Typically, opening 43 is formed by lithography and etching. A single etch or multiple etching can be used to provide opening 43. Although a single opening 43 is described and illustrated, a plurality of similar openings can be formed that stop within the second bottom spacer portion 16M'. The width of opening 43 may vary. In one example, the width of opening 43 can be from 5 nm to 25 nm.

Figure 11:
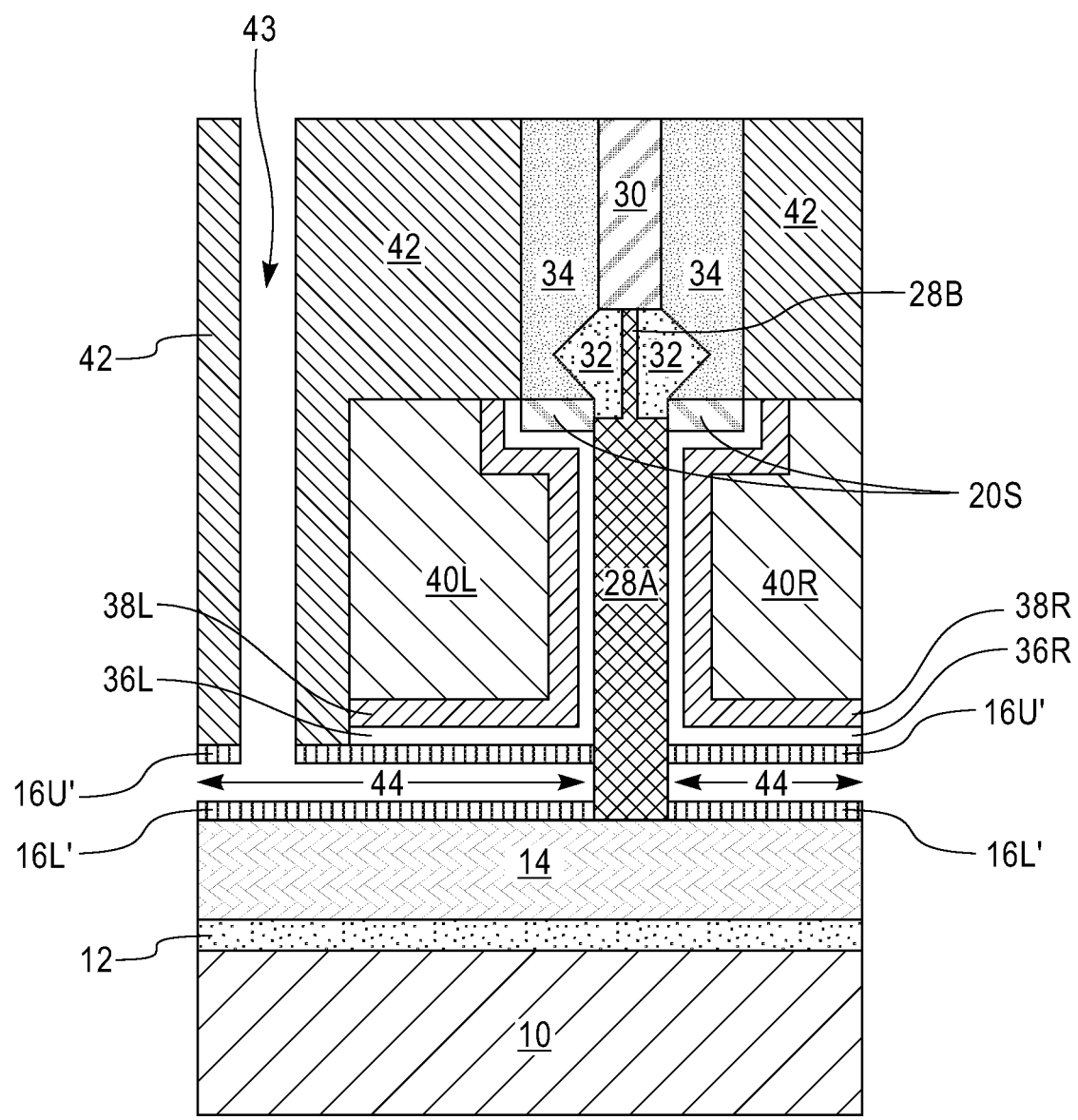
FIG. 11 is a cross sectional view of the exemplary semiconductor structure of FIG. 10 after entirely removing the remaining portion of the second bottom spacer layer of the bottom spacer material stack.

Referring now to FIG. 11, there is illustrated the exemplary semiconductor structure of FIG. 10 after entirely removing the remaining portion of the second bottom spacer portion 16M' of the bottom spacer material stack portion 16P. The second bottom spacer portion 16M' is removed utilizing an etch that is selective in removing the second bottom spacer portion 16M' relative to the first and third bottom spacer portions (16L', 16U'), MOL dielectric material 42, dielectric cap 30, and dielectric spacer 34. A cavity 44 is provided between the first and third bottom spacer portions (16L', 16M') that exposes a portion of the lower portion 28A of the epitaxial semiconductor channel material 28.

Figure 12:
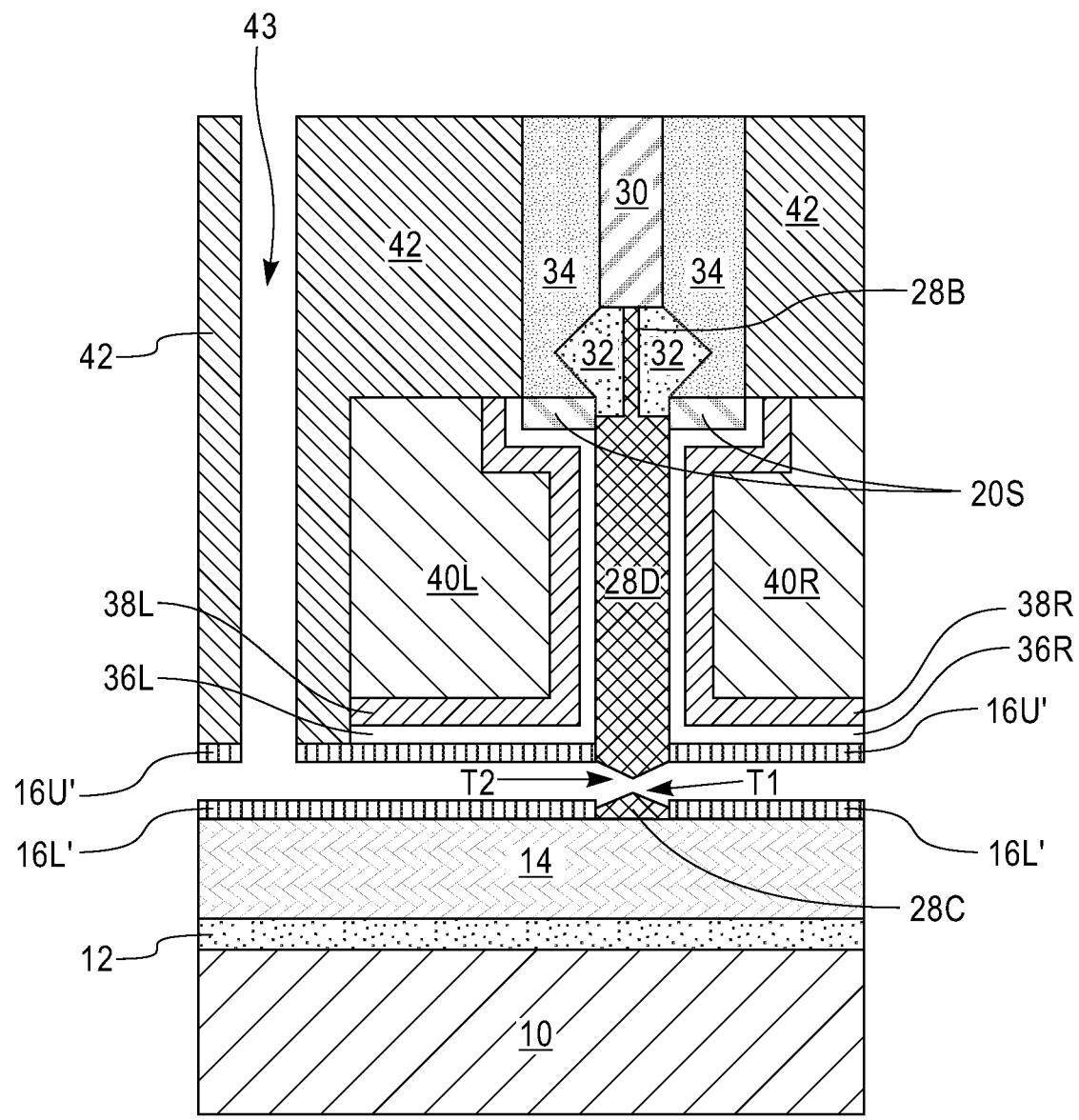
FIG. 12 is a cross sectional view of the exemplary semiconductor structure of FIG. 11 after sigma etching exposed portions of the lower portion of the epitaxial semiconductor channel material to provide an epitaxial semiconductor channel material structure of, from bottom to top, a first region of the epitaxial semiconductor channel material having a faceted top surface and a second region of the epitaxial semiconductor channel material having a faceted bottom surface.

Referring now to FIG. 12, there is illustrated the exemplary semiconductor structure of FIG. 11 after sigma etching the exposed portion of the lower portion 28A of the epitaxial semiconductor channel material 28. Sigma etching is synonymous with the terms "crystallographic etching" and "anisotropic etching along crystal planes. Sigma etching includes utilizing a chemical etchant. Examples of chemical etchants that can be used for the sigma etch include, but are not limited to potassium hydroxide, tetraethylammonium hydroxide, or an aqueous solution of ethylene diamine and pyrocatechol.

The sigma etch is a sigma shape producing etch that cleaves the bottom portion 28A of the epitaxial semiconductor material channel material 28 and provides a first region of the epitaxial semiconductor channel material 28C that is spaced apart from a second region of the epitaxial semiconductor channel material 28D; the upper portion 28B of the original epitaxial semiconductor channel material 28 may be referred to as a third region of the epitaxial semiconductor material. The first region of the epitaxial semiconductor channel material 28C has a faceted top surface, T1, while the second region of the epitaxial semiconductor channel material 28D has a faceted bottom surface T2. As is shown, faceted top surface T1 faces faceted bottom surface T2. Collectively, the first region of the epitaxial semiconductor channel material 28C, the second region of the epitaxial semiconductor channel material 28D, and the third region of the epitaxial semiconductor channel material (i.e., upper portion 28B) may be referred to as an epitaxial semiconductor channel material structure.

Figure 13:
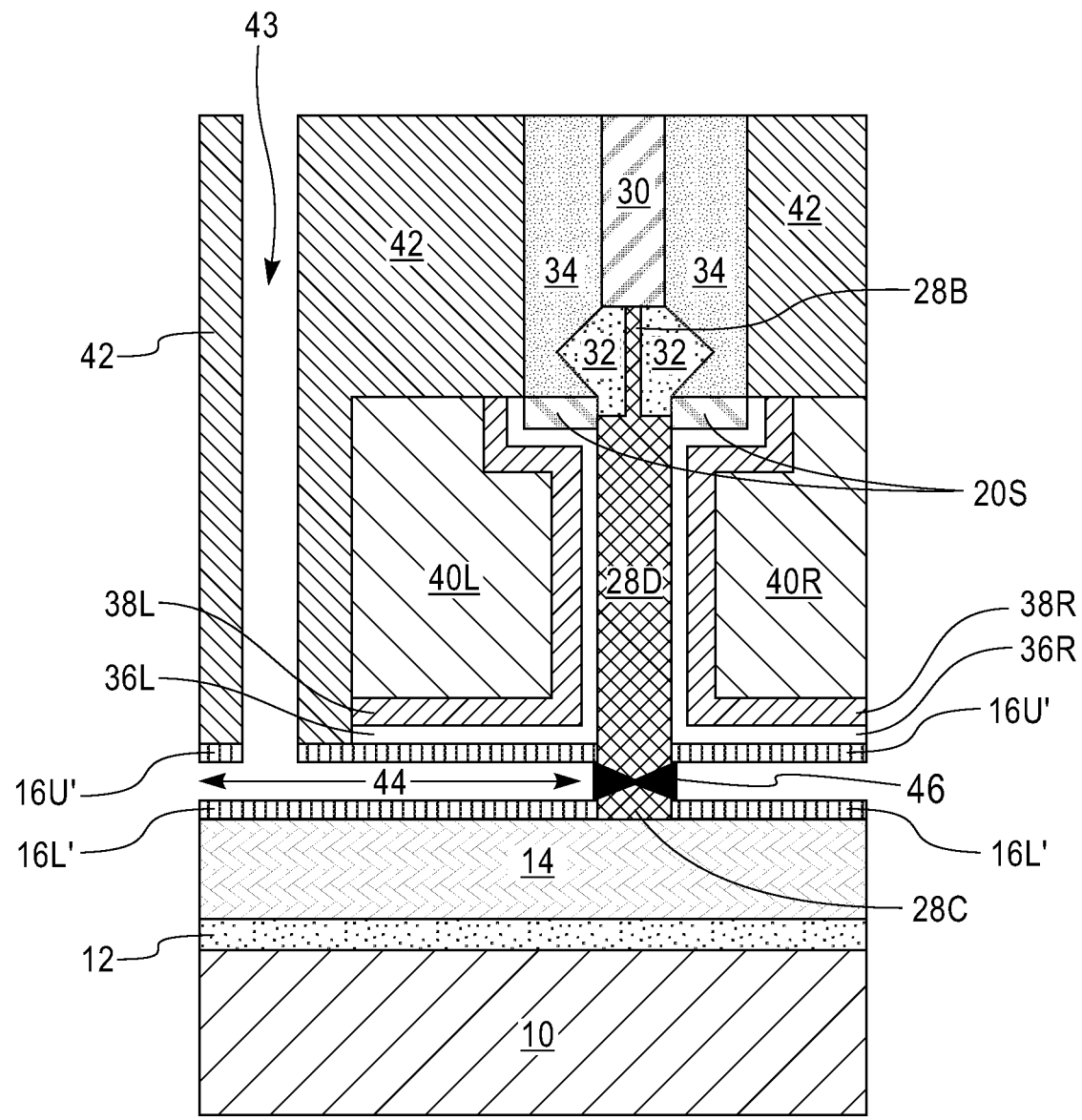
FIG. 13 is a cross sectional view of the exemplary semiconductor structure of FIG. 12 after forming a sigma shaped source/drain extension region between, and in contact with, the top faceted surface of the first region of the epitaxial semiconductor channel material and the bottom faceted surface of the second region of the epitaxial semiconductor channel material.

Referring now to FIG. 13, there is illustrated the exemplary semiconductor structure of FIG. 12 after forming a sigma shaped source/drain extension region 46 from exposed faceted surfaces of the first and second regions of the epitaxial semiconductor channel material (28C, 28D). The sigma shaped source/drain extension region 46 is formed using the faceted surfaces, T1 and T2 as growth surfaces. The sigma shaped source/drain extension region 46 merges the top faceted surface, T1, of the first region of the epitaxial semiconductor channel material 28C to the bottom faceted surface, T2, of the second region of the epitaxial semiconductor channel material 28D. The sigma shaped source/drain extension region 46 is located between a pair of spaced apart bottom spacer portions (i.e., the first bottom spacer portion 16L' and the third bottom spacer portion 16U'). In some embodiments and as is shown, the sigma shaped source/drain extension region 46 extends beyond the outermost sidewalls of the epitaxial channel material structure (28B, 28C, and 28D). Also, and in some embodiments and as is shown in FIG. 13, the sigma shaped source/drain extension region 46 has a middle portion having a first vertical thickness and two end portions having a second vertical thickness which is greater than the first vertical thickness.

The sigma shaped source/drain extension region 46 includes a semiconductor material and a dopant. The semiconductor material of the sigma shaped source/drain extension region 46 can include one of the semiconductor materials mentioned above for the base semiconductor substrate 10. The semiconductor material that provides the sigma shaped source/drain extension region 46 may be the same as, or different from, the semiconductor material of the epitaxial semiconductor channel material 28. The dopant that is present in the sigma shaped source/drain extension region 46 may be the same as, or different from, the dopant present in the bottom source/drain semiconductor material layer 14 and the epitaxial semiconductor channel material structure (28B, 28C, 28D). In one embodiment, carbon, C, can be present in the sigma shaped source/drain extension region 46. In embodiments in which the sigma shaped source/drain extension region 46 has a different dopant than the epitaxial semiconductor channel material structure (28B, 28C, 28D) and the bottom source/drain semiconductor material layer 14, a sharp junction can be provided between the sigma shaped source/drain extension region 46 and the epitaxial semiconductor channel material structure (28B, 28C, 28D). The sharp junction may result in improved electrostatics and external resistance.

The sigma shaped source/drain extension region 46 can be formed utilizing an epitaxial growth process as mentioned above. The dopant that is present in the sigma shaped source/drain extension region 46 can be added during the epitaxial growth process or after epitaxial growth utilizing atomic layer doping and annealing.

Figure 14:
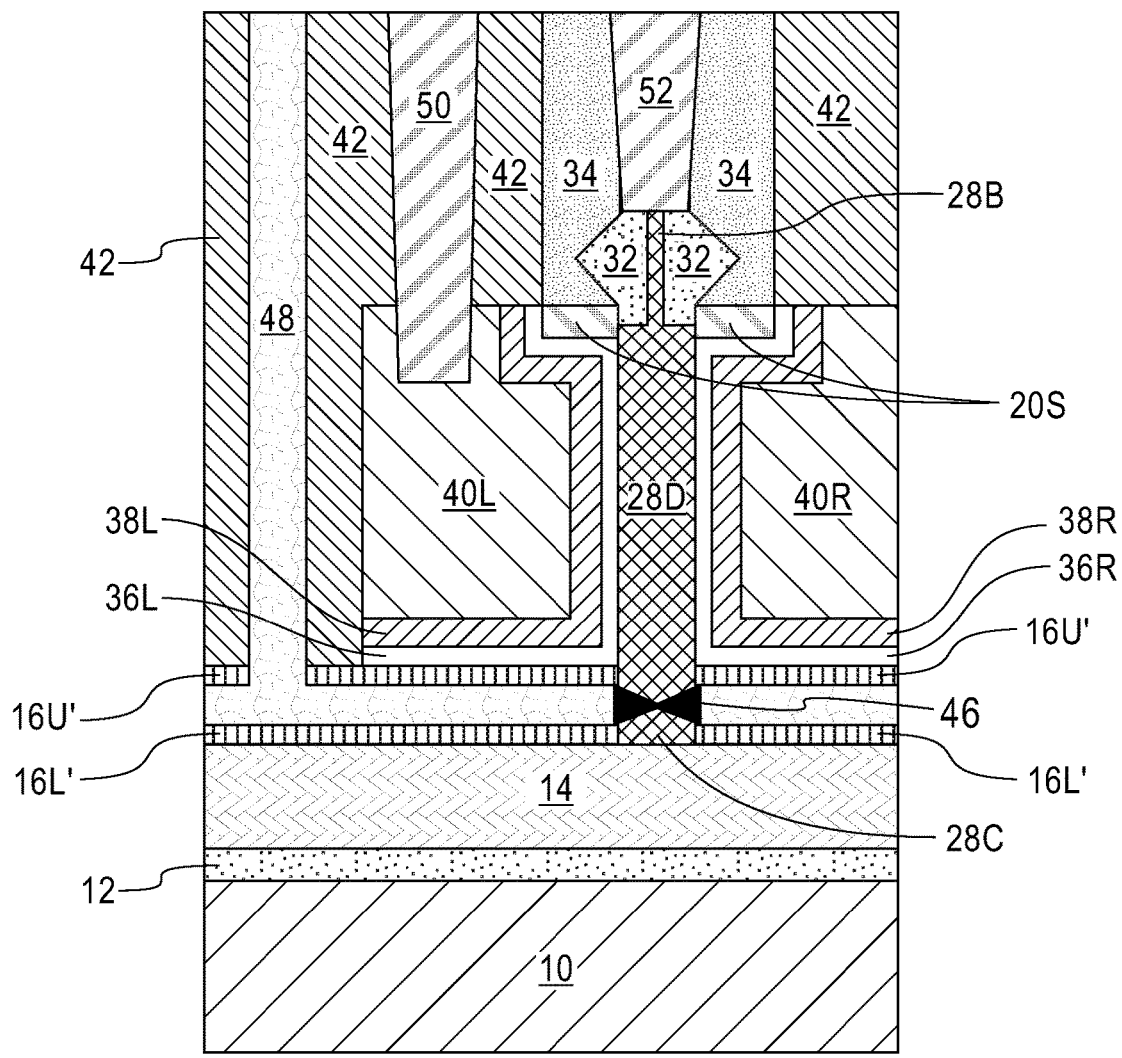
FIG. 14 is a cross sectional view of the exemplary semiconductor structure of FIG. 13 after forming a dielectric filler material into the area previously containing the second bottom spacer layer of the bottom spacer material stack and into the opening formed in the MOL dielectric material, and forming contact structures in the MOL dielectric material.

Referring now to FIG. 14, there is illustrated the exemplary semiconductor structure of FIG. 13 after forming a dielectric filler material 48 into the area previously containing the middle spacer layer of the bottom spacer material stack (i.e., cavity 44) and into the opening 43 formed in the MOL dielectric material 42, and forming contact structures 50, 52 in the MOL dielectric material 42. Dielectric filler material 48 completely fills the cavity 44 and the opening 43 and contacts an end portion of the sigma shaped source/drain extension region 46. Thus, the dielectric filler material 48 laterally surrounds the sigma shaped source/drain extension region 46

Dielectric filler material 48 may include any dielectric material. In some embodiments, dielectric filler material 48 may include one of the dielectric materials mentioned above for MOL dielectric material 42. In one embodiment, the dielectric filler material 48 may be composed of the same dielectric material as MOL dielectric material 42. In another embodiment, dielectric filler material 48 may be composed of a different dielectric material than MOL dielectric material 42. Dielectric filer material 48 may be formed utilizing one of the deposition process mentioned above in forming MOL dielectric material 42. A planarization process may follow the deposition process.

As mentioned above, contact structures 50, 52 can be formed into the MOL dielectric material 42. Notably, a gate contact structure (or word line) 50 can be formed extending through the MOL dielectric material 42 and contacting the outer gate conductor portion 40L, 40R of one of the functional gate structures, and a source/drain contact structure (bit line) 52 can be formed contacting each top source/drain structure 32. The various contact structures can be formed by first providing a contact opening within the MOL material 42. Lithography and etching, as defined above, can be used to provide each contact opening. Each contact opening is then filled with at least a contact metal such as, for example, copper, tungsten or a copper-tungsten alloy. In some embodiments, a metal semiconductor alloy, i.e., a silicide, may be formed prior to filling each contact opening with a contact metal. It is noted that the dielectric cap 30 is removed in forming contact structure 52.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a bottom source/drain semiconductor material layer located above a base semiconductor substrate;
an epitaxial semiconductor channel material structure extending upward from a topmost surface of the bottom source/drain semiconductor material layer, the epitaxial semiconductor channel material structure comprises, from bottom to top, a first region of an epitaxial semiconductor channel material having a faceted top surface, a second region of the epitaxial semiconductor channel material having a bottom faceted surface, and a third region of the epitaxial semiconductor channel material;
a functional gate structure located on each side of the epitaxial semiconductor channel structure;
a top source/drain structure extending outward from each sidewall of the third region of the epitaxial semiconductor channel material; and
a sigma shaped source/drain extension region present between, and in contact with, the top faceted surface of the first region of the epitaxial semiconductor channel material and the bottom faceted surface of the second region of the epitaxial semiconductor channel material.

2. The semiconductor structure of claim 1, further comprising a semiconductor material layer positioned between the bottom source/drain semiconductor material layer and the base semiconductor substrate, wherein the semiconductor material layer is of a first conductivity type and the source/drain semiconductor material layer is of a second conductivity type that is opposite from the first conductivity type.

3. The semiconductor structure of claim 1, wherein the sigma shaped source/drain extension region is located between a pair of spaced apart bottom spacer portions.

4. The semiconductor structure of claim 1, wherein a portion of each top source/drain structure contacts a topmost surface of the second region of the epitaxial semiconductor channel material.

5. The semiconductor structure of claim 1, wherein the first, second and third regions of the epitaxial semiconductor channel material comprise a same semiconductor material.

6. The semiconductor structure of claim 1, wherein the sigma shaped source/drain extension region extends beyond the outermost sidewalls of the epitaxial semiconductor channel material structure.

7. The semiconductor structure of claim 1, wherein the sigma-shaped source/drain extension region contains a different dopant than the bottom source/drain semiconductor material layer and the epitaxial semiconductor channel material structure.

8. The semiconductor structure of claim 1, wherein the sigma shaped source/drain extension region has a middle portion having a first vertical thickness and two end portions having a second vertical thickness which is greater than the first vertical thickness.

9. The semiconductor structure of claim 1, further comprising a dielectric material laterally surrounding each functional gate structure, the dielectric material comprising a middle-of-the line (MOL) dielectric material and a dielectric filler material, wherein a portion of the dielectric filler material is located beneath each functional gate structure and contacts an end portion of the sigma shaped source/drain extension region.

10. The semiconductor structure of claim 9, further comprising a gate contact structure extending through the MOL dielectric material and contacting an outer gate conductor portion of one of the functional gate structures, and a source/drain contact structure contacting each top source/drain structure.

11. A method of forming a semiconductor structure, the method comprising:
forming a material stack on a base semiconductor substrate, the material stack comprising a bottom source/drain semiconductor material layer, a bottom spacer material stack, a sacrificial gate material layer, a top spacer layer, and a hard mask layer, the bottom spacer material stack comprises, from bottom to top, a first bottom spacer layer, a second bottom spacer layer and a third bottom spacer layer;
forming an opening in the material stack to expose a portion of the bottom source/drain semiconductor material layer;
forming an epitaxial semiconductor channel material extending upward from the exposed portion of the bottom source/drain semiconductor material layer;
removing remaining portions of the hard mask layer;
forming a top source/drain structure extending outward from each sidewall of an upper portion of the epitaxial semiconductor channel material;
removing remaining portions of the top spacer layer and the sacrificial gate material layer to expose a lower portion of the epitaxial semiconductor channel material;
forming a functional gate structure on each side of the lower portion of the epitaxial semiconductor channel material;
removing the entirety of the second bottom spacer layer to provide a cavity that exposes a portion of the lower portion of the epitaxial semiconductor channel material;
performing a sigma etch on the exposed portion of the lower portion of the epitaxial semiconductor channel material to provide a first region of the epitaxial semiconductor channel material having a top faceted surface and a second region of the epitaxial semiconductor channel material having a faceted bottom surface; and
forming a sigma shaped source/drain extension region between, and in contact with, the top faceted surface of the first region of the epitaxial semiconductor channel material and the bottom faceted surface of the second region of the epitaxial semiconductor channel material.

12. The method of claim 11, wherein after forming each functional gate structure and prior to removing the entirety of the second bottom spacer layer, a middle-of-the-line (MOL) dielectric material is formed laterally surrounding each functional gate structure.

13. The method of claim 12, wherein the removing the entirety of the second bottom spacer layer comprises:
forming an opening in the MOL dielectric that exposes a portion of the second bottom spacer layer; and
etching the second bottom spacer layer selective to the first and third bottom spacer layers.

14. The method of claim 13, further comprising filling the opening and the cavity with a dielectric fill material after the forming of the sigma shaped source/drain extension region.

15. The method of claim 12, further comprising forming a gate contact structure extending through the MOL dielectric material and contacting an outer gate conductor portion of one of the functional gate structures, and a source/drain contact structure contacting each top source/drain structure.

16. The method of claim 11, wherein the performing the sigma etch comprises utilizing a chemical etchant.

17. The method of claim 11, wherein the forming the sigma shaped source/drain extension region comprises epitaxial growth of a semiconductor material.

18. The method of claim 17, wherein a dopant is introduced into the semiconductor material during epitaxial growth or after utilizing atomic layer doping.

19. The method of claim 18, wherein the dopant that provides the sigma shaped source/drain extension region is different from a dopant that provides the bottom source/drain semiconductor material layer.

20. The method of claim 11, further comprising laterally recessing the upper portion of the epitaxial semiconductor channel material, the laterally recessing is performed after removing remaining portions of the hard mask layer, and prior to forming the top source/drain structure.

\* \* \* \* \*